United States Patent [19]

Katoh

[11] Patent Number: 5,141,896
[45] Date of Patent: Aug. 25, 1992

[54] PROCESS FOR THE PRODUCTION OF CROSSING POINTS FOR INTERCONNECTIONS OF SEMICONDUCTOR DEVICES

[75] Inventor: Takuya Katoh, Minato, Japan
[73] Assignee: NEC Corporation, Tokyo, Japan
[21] Appl. No.: 761,568
[22] Filed: Sep. 18, 1991
[30] Foreign Application Priority Data
  Sep. 18, 1990 [JP]  Japan ................... 2-248235
[51] Int. Cl.$^5$ ........................................... H01L 21/44
[52] U.S. Cl. .................................. 437/195; 437/228; 437/978
[58] Field of Search ................ 437/195, 228, 978
[56] References Cited
  U.S. PATENT DOCUMENTS
  4,523,372  6/1985  Balda et al. ................... 437/195
  5,084,416  1/1992  Ozaki et al. .................. 437/195

Primary Examiner—Brian E. Hearn
Assistant Examiner—Laura M. Holtzman
Attorney, Agent, or Firm—Sughrue, Mion, Zinn, Macpeak & Seas

[57] ABSTRACT

In a semiconductor device, an inter-level insulating film is formed at solid crossing points between upper level interconnections and lower-level interconnections, excepting via hole portions. This means that mechanical support between interconnection levels is given by solid crossing points between interconnections. For this, a semiconductor device having high durabilities against thermal and mechanical impacts can be obtained.

Further, since inter-level regions other than the solid crossing points are made vacant to form a cavity, coupling capacity can be reduced to $\frac{1}{3}$ to $\frac{1}{2}$ of an ordinary multilevel interconnections wherein inter-level regions are fully filled with an inter-level insulating film.

1 Claim, 11 Drawing Sheets

PROCESS FOR THE PRODUCTION OF CROSSING POINTS FOR INTERCONNECTIONS OF SEMICONDUCTOR DEVICES

BACKGROUND OF THE INVENTION

1. Field of the Invention

The present invention relates to a semiconductor device and a process for the production thereof and more particularly to a semiconductor device having multilevel interconnections and a process for the production thereof.

2. Description of the Prior Art

In recent years, the integration density of semiconductor devices has been raised and the mutilevel interconnections have been used more frequently, as the scale of the system realized by the use of semiconductor devices is increased and the fabrication technology for semiconductor devices with fine geometry is advanced.

With the increase in the integration density of semiconductor devices, the space between the interconnections also decreases. Because of this, the parasitic capacitance incidental to the interconnections increases.

In order to reduce such parasitic capacitance, it has been proposed to remove an inter-layer insulation film to make the space between the interconnection layers vacant, by supporting the upper layer interconnections only by contact pillars at via hole positions, in a report by Eiichi YAMAMOTO, et al. entitled "Multilevel Metal Interconnect for Ultra Speed LSI using Al/Polymide Contact Method" numbered 456 in a preprint article of "Electronic Information Communication Society 70th Anniversary General National Grand Meeting" (1987) at pages 2-260. In such multilevel interconnections of aerial interconnection construction as above, the coupling capacitance between interconnection levels is reduced to $\frac{1}{4}$ to $\frac{1}{3}$ of that of ordinary multilevel interconnections completely filled with inter-layer insulating films.

The above-mentioned prior art multi-level interconnections having aerial interconnection construction is considered to have ideal construction with respect to reduction of coupling capacitance between interconnection levels, but to have a defect that is to weak against mechanical impact since the phsical support between imterconnection levels is achieved only bt conductive contact pillars for electrically connecting interconnection levels. Further, thermal stress of interconnections caused by thermal expansion owing to Joule's heat is not dispersed but concentrated to the contact pillars. For such thermal and mechanical impacts, it is liable to occur that interconnections are cut open or short-circuited and so it is impracticable to really apply the multilevel interconnections having aerial interconnection construction to a large scale intergrated circuit.

The present inventor formerly presented together with other co-inventors, in U. S. Ser. No. 07/511885 filed on Apr. 20, 1990 a semiconductor device that has a feature in the spatial relationship between interconnection levels and the intermediate insulating films. In the lower part of the second and/or subsequent levels of interconnection there exist intermediate insulating films that have a pattern which is the same as the pattern of the interconnection. Becuase of this arrangement, the intermediate insulating film does not exist between the interconnections on the same level. The first structure of the multilevel interconnection has the intermediate insulating films formed in wall-like shape, with the lower end of the intermediate insulating films reaching an underlying insulating layer formed on the surface of the semiconducture substrate. The second structure of the multilevel interconnection is a quasi air gap metallization structure. This construction has markedly improved thermal and mechanical strength compared with the above-mentioned aerial interconnection construction, but the reduction of coupling capacitance between interconnection levels is not so large as the aerial interconnection construction.

SUMMARY OF THE INVENTION

An object of the present invention therefore is to attain both of the reduction of coupling capacitance between interconnection levels and improvement of thermal and mechanical strength in a semiconductor device.

Thus the present invention provides a semiconductor device comprising
- (a) a lower-level inter-level insulating film formed on a semiconductor substrate,
- (b) lower-level interconnections formed on the lower-level inter-level insulating film (a),
- (c) an upper-level inter-level insulating film formed on the lower-level interconnections (b), and
- (d) an upper-level interconnections formed on the upper-level inter-level insulating film (c) to form solid crossing points with the lower-level interconnections (b) and connected to the lower-level interconnections (b) through via holes formed in the upper-level inter-level insulating film (c);

said upper-level inter-level insulating film (c) being formed only at solid crossing points between the upper-level interconnections (d) and the lower-level interconnections (b) to form a cavity between the lower-level inter-level insulating film (a) and the upper-level interconnections (d).

The present invention further provides a process for the production of a semiconductor device comprising steps of:
1. forming on a semiconductor substrate, a lower-level inter-level insulating film of an inorganic material,
2. forming on the lower-level inter-level insulating film, a lower-level interconnection layer, an upper-level inter-level insulating film and a photoresist film in this order,
3. patterning the photoresist film to form a first mask,
4. patterning by means of this first mask, the upper-level inter-level insulating film and the lower-level interconnection layer to form lower-level interconnections,
5. forming an organic insulating film on an entire surface including the patterned upper-level inter-level insulating film, after removing the first mask,
6. etching the organic insulating film to expose the surface of the patterned upper-level inter-level insulating film,
7. forming via holes in the exposed upper-level inter-level insulating film,
8. forming an upper level interconnection layer on the entire surface and at the same time filling the via holes with this upper-level interconnection layer, (9) forming on this upper-level interconnection layer, a photoresist film and patterning the same to form a second mask,

(10) patterning by means of this second mask, the upper-level interconnection layer and the upper-level inter-level insulating film to form upper-level interconnections elongated in the direction to form solid crossing points with the lower-level interconnections, and

(11) removing the second mask and the remaining organic insulating film.

DESCRIPTION OF THE PREFERRED EMBODIMENTS

The present invention will be explained below further in detail with respects to its some embodiments shown in FIGS. 1 to 5.

Figure 1:
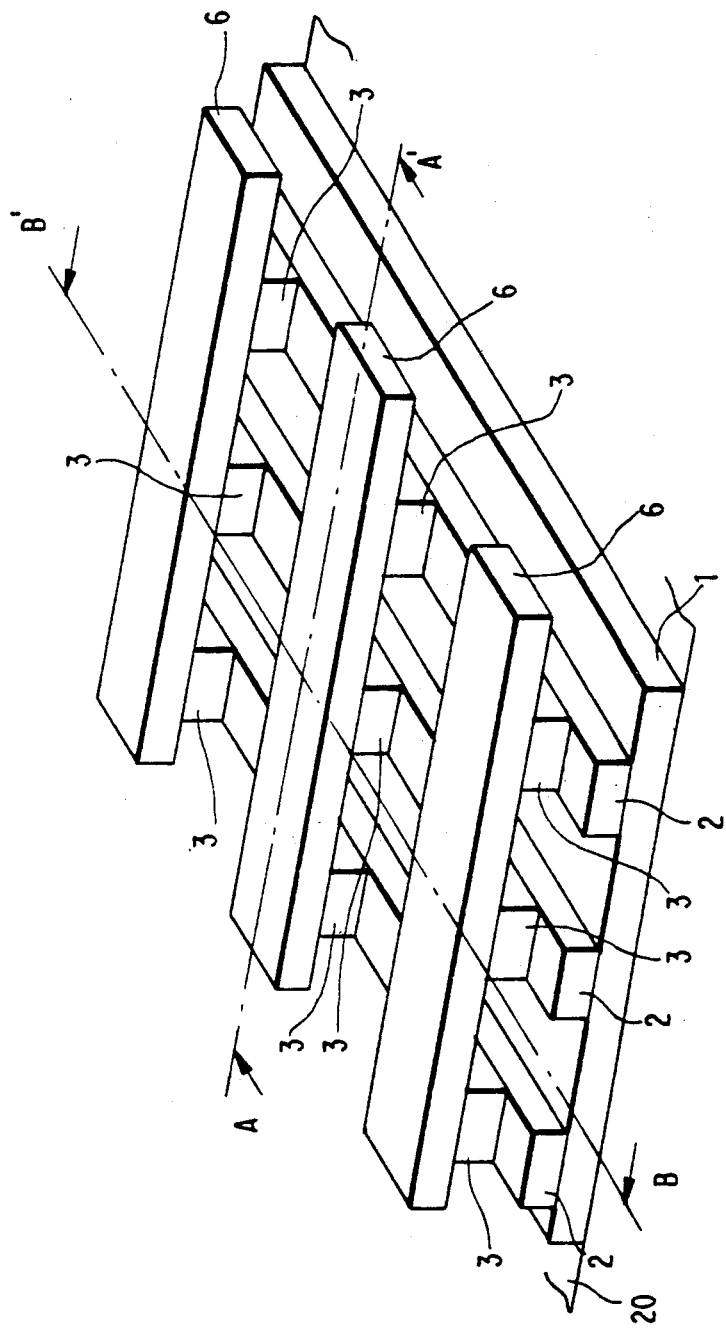
FIG. 1 shows a perspective view to schematically explain the first embodiment of the present invention.

In FIG. 1, an example of two-level interconnections is shown by a perspective view, wherein on a lower level inorganic insulating film 1 consisting of a silicon oxide film or the like formed on a semiconductor substrate 20, first-level interconnections 2 consisting of aluminium or the like are formed. The space between the first-level interconnections 2 is vacant to form a cavity. On the first-level interconnections 2, second-level interconnections 6 consisting of aluminium or the like are formed with interposed first inter-level inorganic insulating film 3 consisting of a silicon oxide film or the like. The first inter-level inorganic insulating film 3 exists at solid crossing points between the first-level interconnections 2 and the second-level interconnections 6, excepting via hole portions (not shown in the drawing) for forming contact pillars which electrically connects the first-level interconnections 2 and the second-level interconnections 6. Further, the first-level inorganinc insulating film 3 does not exist at portions other than the above mentioned crossing points and so these portions are vacant to form a cavity.

In this first embodiment of the present invention, the first-level and the second-level interconnections form solid crossing points with interposed inter-level inorganic insulating film at portions other than via hole portions, differently from the above mentioned aerial interconnection construction. Therefore the second-level interconnections 6 are mechanically supported on the first-level interconnections 2 also at these solid crossing points. It can be considered that this construction has the same construction as the ordinary multi-level interconnections wherein the space between interconnections is fully filled with an inter-level insulating film only at the above mentioned solid crossing points, and the same construction as the aerial interconnection construction at the other portions. Since the ratio of the above mentioned solid crossing points occupied in the entire coupling capacitance is ordinarily not higher than $\frac{1}{4}$, although it depends upon configuration of interconnections, it can be said that the coupling capacitance in this embodiment is to an extent of $\frac{1}{3}$ to $\frac{1}{4}$ of that of the ordinary multilevel interconnections wherein the space between interconnections is fully filled with an inter-level insulating film.

Next, the second embodiment of the present invention will be explained with referrece to FIGS. 2(a) to 2(h) which are cross sections along the line A—A' in FIG. 1 in the direction of the second-level interconnections 6 and FIGS. 3(a) to 3(e) which are cross sections along the line B—B' in FIG. 1 in the direction of the first-level interconnections 2.

Figure 2A:
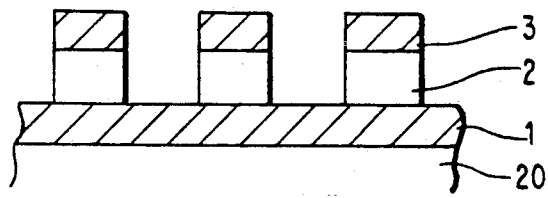
FIGS. 2(a) to 2(h) and FIGS. 3(a) to 3(e) show cross sections to schematically explain the production steps of a semiconductor chip as the second embodiment of the present invention.
Figure 2B:
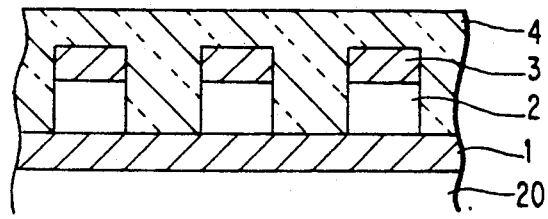

First, as shown in FIG. 2(a), a lower level inorganic insulating film 1 of a silicon oxide film or the like is formed on a semiconductor substrate 20 and the a first-level interconnection layer of an aluminum film or the like is formed to have a thickness of about 0.5 μm. Further, a first inter-level inorganic insulating film 3 of a silicon oxide film or the like is formed thereon to have a thickness of about 0.5 μm. Next, a photoresist is coated and patterned, the first inter-level inorganic insulating film 3 and the first-level interconnection layer are etched by using the patterned photoresist as a mask to form first-level interconnections 2, and the photoresist is removed. Next, as shown in FIG. 2(b), a first inter-level organic insulating film 4 is formed to have a thickness of about 1.5 μm by polyinide or the like by means of a spin-on method.

Figure 2C:
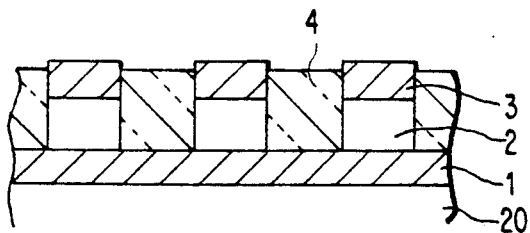
Figure 2D:
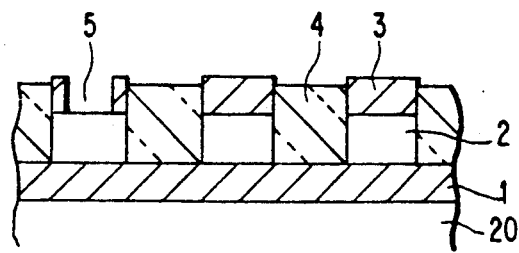

Then as shown in FIG. 2(c), the first inter-level organic insulating film 4 is etched by a plasma etching method by using oxygen gas, so that the surface of the first inter-level inorganic insulating film 3 is exposed but the first inter-level organic insulating film 4 existing at lateral side of the first inter-level inorganic insulating film 3 is retained. Next as shown in FIG. 2(d), via holes 5 are opened at desired positions in the first inter-level inorganic insulating film 3 by means of an ordinary photolithography method.

Figure 2E:
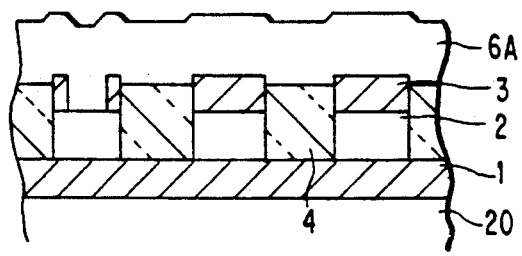
Figure 2F:
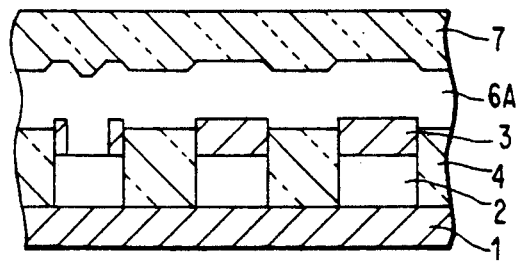
Figure 3A:
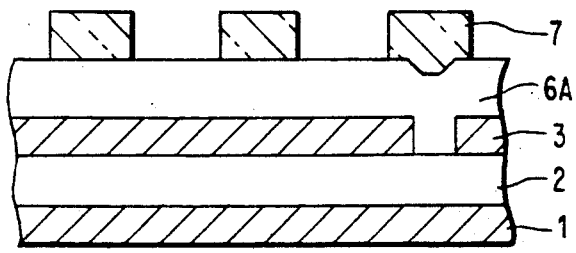

Then as shown in FIG. 2(e), a second-level interconnection layer 6A is formed to have a thickness of about 0.5 μm an aluminium film or the like by means of a magnetron sputtering method. Next, as shown in FIGS. 2(f) and 3(a), a photoresist is coated and patterned to form a mask 7 for a second-level interconnections.

Figure 3B:
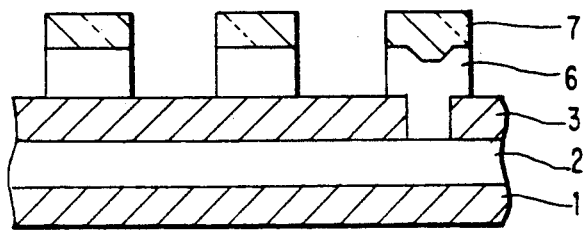
Figure 3C:
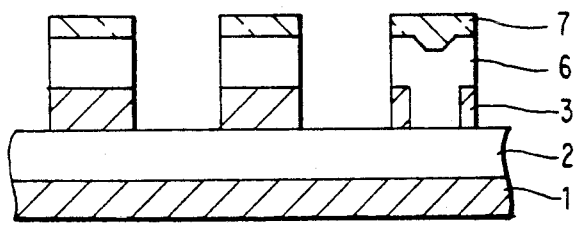

As shown in FIG. 3(b), the second-level interconnection layer 6A is patterned by anisotropic plasma etching by chlorine-containing gas or the like through the mask 7 to form the second-level interconnections 6. Next as shown in FIG. 3(c), the first inter-level inorganic insulating film 3 is patterned by anisotropic plasma etching by fluorine-containing gas or the like.

Figure 2G:
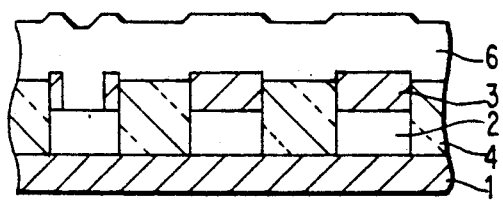
Figure 2H:
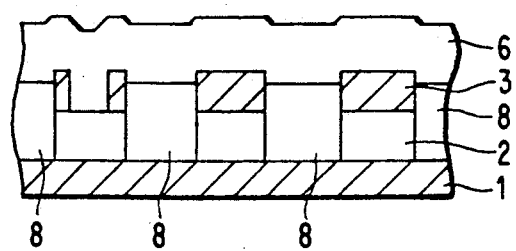
Figure 3E:
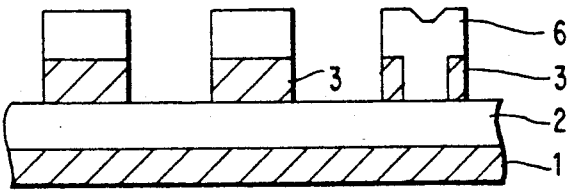
Figure 3F:
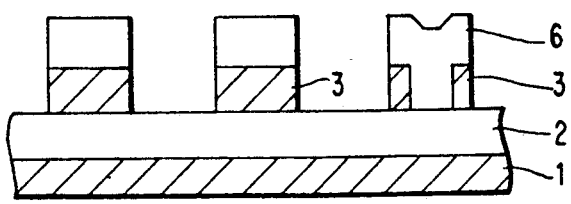

The mask 7 is then removed as shown in FIGS. 2(g) and 3(d). The first inter-level organic insulating film 4 is removed as shown in FIGS. 2(h) and 3(e) by isotropic plasma etching by oxygen gas to form a cavity 8. This cna be carried out simultaneously with removal of the mask 7 in the former production step.

By this second embodiment of the present invention, it is possible to realize the interconnection construction as shown in FIG. 1. In this production process, it is possible to make the patterning of the first inter-level inorganic insulating film 3 by utilizing the lithography of the patterning of the first-level interconnections 2 and that of the second-level interconnections 6 and so no additional lithography steps are required. This enables to avoid increase of number of production steps.

FIGS. 4(a) to 4(h) and 5(a) to 5(l) show another embodiment of the present invention wherein a third-level interconnections are formed in addition to the two-level interconnection construction as shown in the above mentioned second embodiment. The third-level interconnections are formed along the line B—B' in FIG. 1 in the direction of the first-level interconnections 2. FIGS. 4(a) to 4(h) are cross sections along the line A—A' in FIG. 1 in the direction of the second-level interconnections 6 and FIGS. 5(a) to 5(l) are cross sections along the line B—B' in FIG. 1 in the direction of the first-level interconnections 2.

Figure 4A:
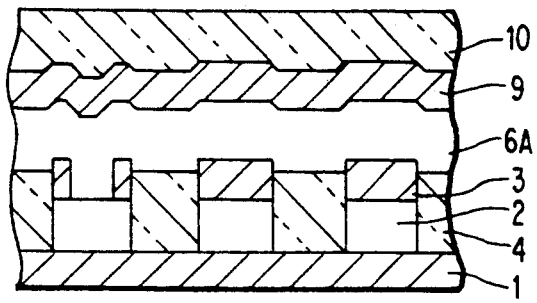
FIGS. 4(a) to 4(h) and FIGS. 5(a) to 5(l) show cross sections to schematically explain the production steps of a semiconductor chip as the third embodiment of the present invention.
Figure 5A:
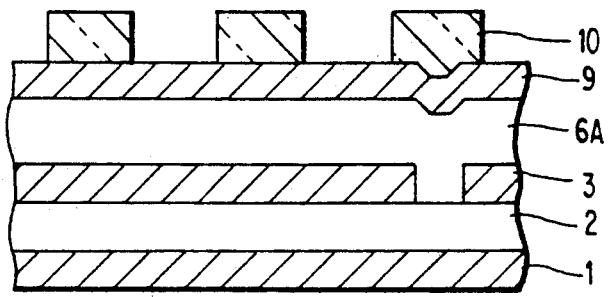
Figure 5B:
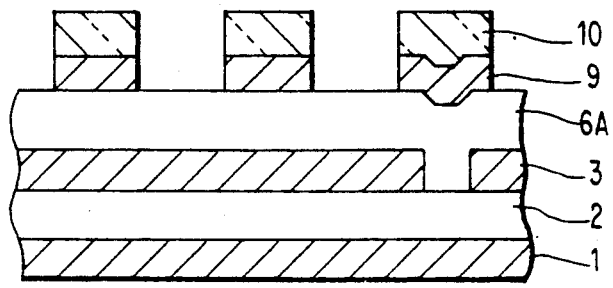

As shown in FIGS. 4(a) and 5(a), the construction as shown in FIG. 2(e) of the second embodiment of the present invention is formed, that is, up to the formation of the second-level interconnection layer 6A. Then a second inter-level inorganic insulating film 9 of a silicon oxide film or the like is formed thereon to have a thickness of about 0.5 μm. Next, the photoresist for the second-level interconnections is patterned to form a mask 10. As shown in FIG. 5(b), the second inter-level inorganic insulating film 9 patterned by anisotropic plasma etching by fluorine-containing gas through the mask 10.

Figure 5C:
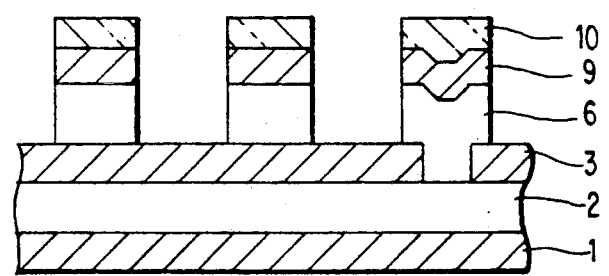
Figure 5D:
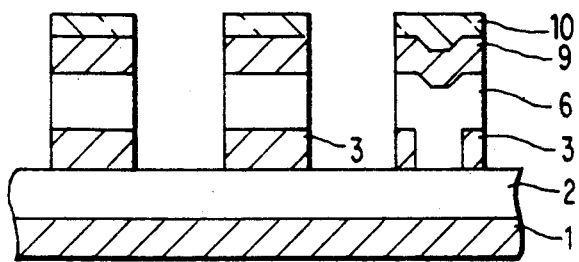

As shown in FIG. 5(c), the second-level interconnection layer 6A is patterned by anisotropix plasma etching by chlorine-containing gas or the like to form the second-level interconnections 6. Then as shown in FIG. 5(d), the first inter-level inorganic insulating film 3 is patterne by anisotropic plasma etching by fluorine-containing gas or the like.

Figure 4B:
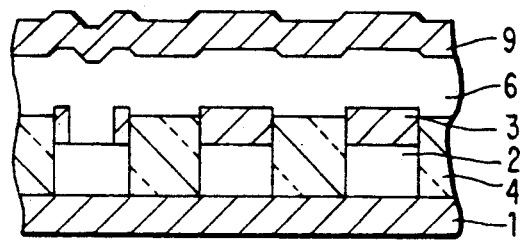
Figure 4C:
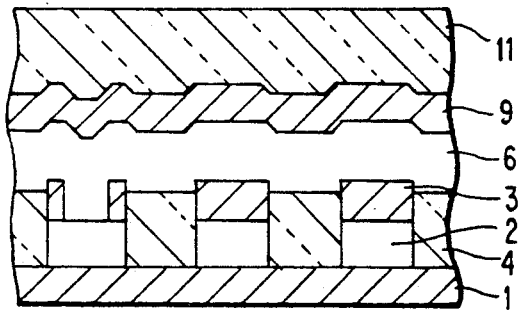
Figure 5E:
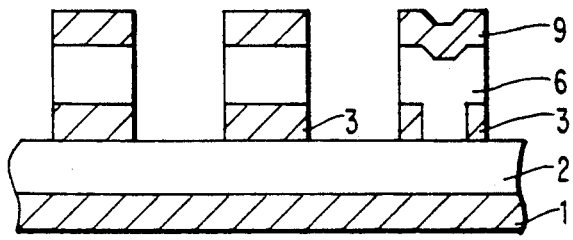
Figure 5F:
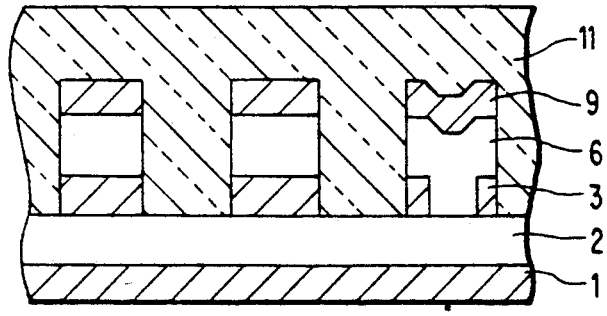

As shown in FIGS. 4(b) and 5(e), the mask 10 is removed and as shown in FIGS. 4(c) and 5(f), a second inter-level organic insulating film 11 is formed to have a thickness of about 2 μm by polymide or the like by means of a spin-on method.

Figure 5G:
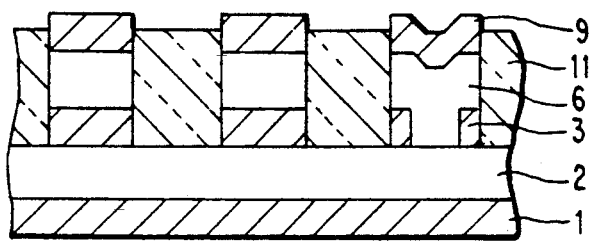
Figure 5H:
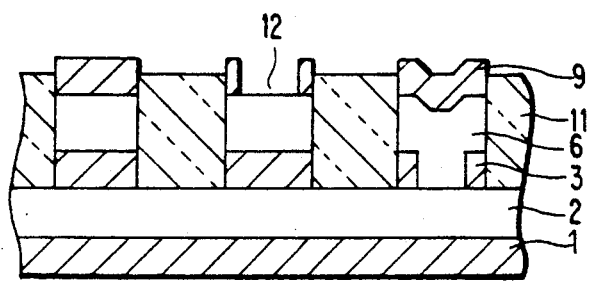

Then as shown in FIG. 5(g) the second inter-level organic insulating film 11 is etched by a plasma etching method by using oxygen gas, so that the surface of the second inter-level inorganic insulating film 9 is exposed but the second inter-level organic insulating film 11 existing at lateral side of the second inter-level inorganic insulating film 9 is retained. Next as shown in FIG. 5(h), via holes 12 are opened at desired positions in the second inter-level inorganic insulating film 9 by means of an ordinary photolithography method.

Figure 4D:
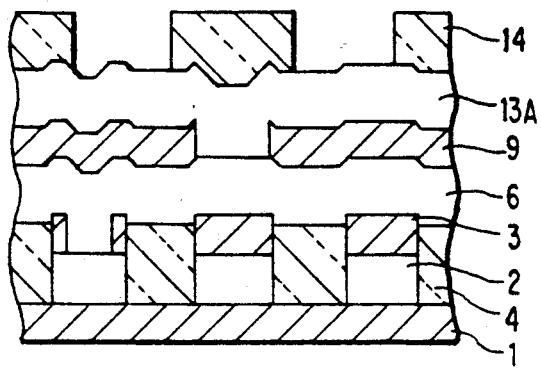
Figure 5I:
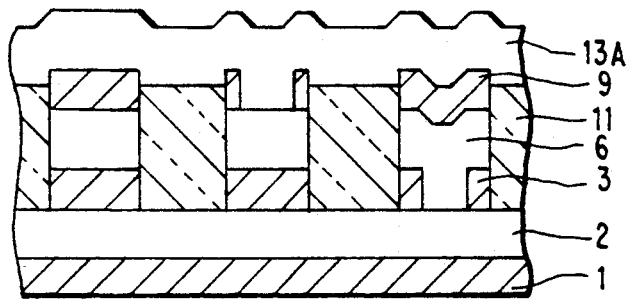
Figure 5J:
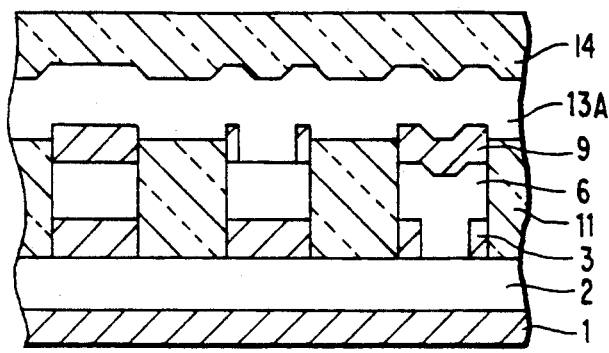

Then as shown in FIG. 5(i), a third-level interconnection layer 13A is formed to have a thickness of about 0.5 μm by an aluminum film or the like by means of a magnetron sputtering method. Next, as shown in FIGS. 4(d) and 5(j), a photoresist is coated and patterened to form a mask 14 for a third-level interconnections.

Figure 4E:
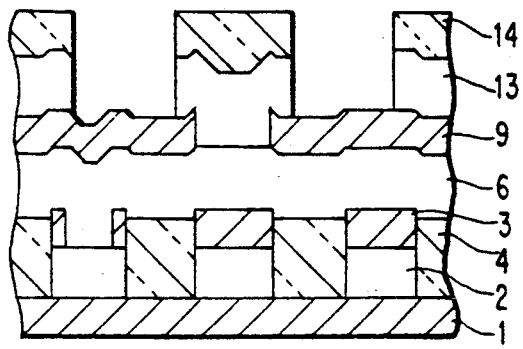
Figure 4F:
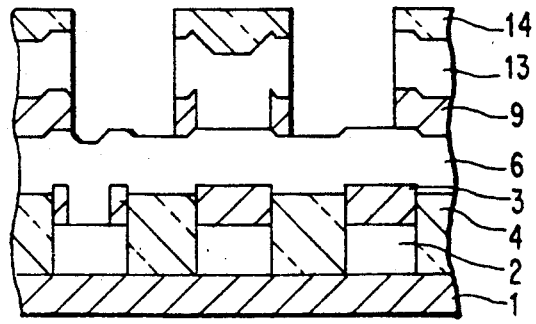

As shown in FIG. 4(e), the third-level interconnection layer 13A is patterned by anisotropic plasma etching by chlorine-containing gas or the like through the mask 14 to form the third-level interconnections 13. Next as shown in FIG. 4(f), the second inter-level inorganic insulating film 9 is patterned by anisotropic plasma etching by fluorine-containing gas or the like.

Figure 4G:
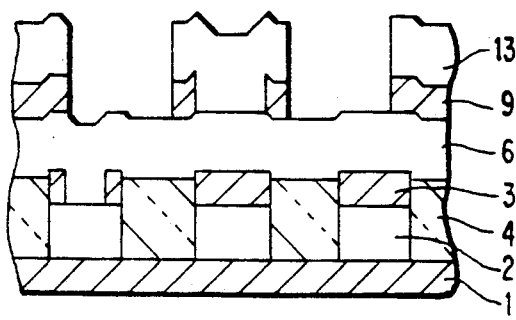
Figure 4H:
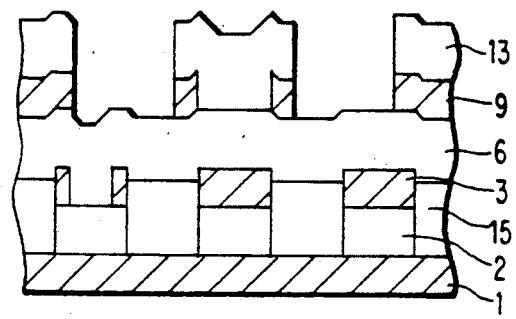
Figure 5K:
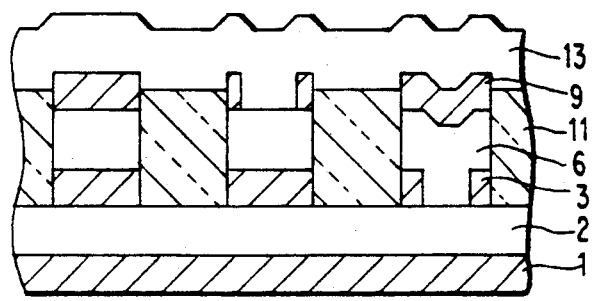
Figure 5L:
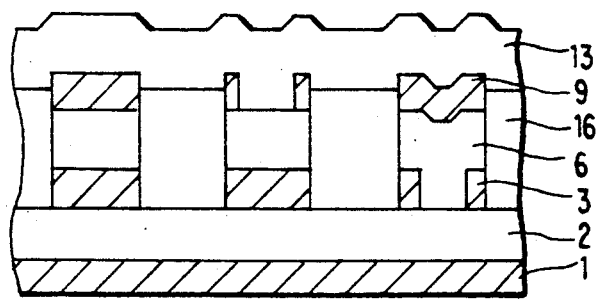

The mask 14 is then removed as shown in FIGS. 4(g) and 5(k). The first inter-level organic insulating film 4 and the second inter-level organic insulating film 11 are removed as shown in FIGS. 4(h) and 5(l) by isotropic plasma etching by oxygen gas to form a cavity 15 and a cavity 16. This can be carried out simultaneously with removal of the mask 14 in the former production step.

In this third embodiment of the present invention, it is possible to make the patterning of the first inter-level inorganic insulating film 3 by utilizing the lithography of the patterning of the first-level interconnections 2 and that of the second-level interconnections 6 and also to make the patterning of the second inter-level inorganic insulating film 9 by utilizing the lithography of the patterning of the second-level interconnections 6 and that of the third-level interconnections 13 and so no additional lithography steps are required. This enables to avoid increase of number of production steps.

The interconnection construction as formed in this third embodiment of the present invention has small coupling capacity owing to small dielectric constant of the cavities. Further, since the second-level intereconnections 6 are supported by the first inter-level inorganic insulating film 3 and the third-level interconnections 13 are supported by the second inter-level inorganic insulating film 9, a three-level interconnection construction durable against thermal and mechanical impacts can be obtained.

As explained above in detail, according to the present invention, an inter-level insulating film is formed at solid crossing points between upper-level interconnections and lower-level interconnections, excepting via hole portions. This means that mechanical support between interconnection levels is given by solid crossing points between interconnections. For this, a semiconductor device having high durability against thermal and mechanical impacts can be obtained.

Further, since inter-level regions other than the solid crossing points are made vacant to form a cavity, coupling capacity can be reduced to $\frac{1}{3}$ to $\frac{1}{4}$ of an ordinary multilevel interconnections wherein inter-level regions are fully filled with an inter-level insulating film.

I Claim:

1. A process for the production of a semiconductor device comprising steps of:
   (1) forming on a semiconductor substrate, a lower-level inter-level insulating film of an inorganic material,
   (2) forming on the lower-level inter-level insulating film, a lower-level interconnection layer, an upper-level inter-level insulating film and a photoresist film in this order,
   (3) patterning the photoresist film to form a first mask,
   (4) patterning by means of this first mask, the upper-level inter-level insulating film and the lower-level interconnection layer to form lower-level interconnections,
   (5) forming an organic insulating film on an entire surface including the patterned upper-level inter-level insulating film, after removing the first mask,
   (6) etching the organic insulating film to expose the surface of the patterned upper-level inter-level insulating film,
   (7) forming via holes in the exposed upper-level inter-level insulating film,
   (8) forming an upper level interconnection layer on the entire surface and at the same time filling the via holes with this upper-level interconnection layer,
   (9) forming on this upper-level interconnection layer, a photoresist film and patterning the same to form a second mask.
   (10) patterning by means of this second mask, the upper-level interconnection layer and the upper-level inter-level insulating film to form upper-level interconnections elongated in the direction to form solid crossing points with the lower-level interconnections, and
   (11) removing the second mask and the remaining organic insulating film.

* * * * *